(12) United States Patent
Otsubo et al.

(10) Patent No.: US 12,205,862 B2
(45) Date of Patent: Jan. 21, 2025

(54) MODULE

(71) Applicant: Murata Manufacturing Co., Ltd., Nagaokakyo (JP)

(72) Inventors: Yoshihito Otsubo, Nagaokakyo (JP); Yuji Kataoka, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 267 days.

(21) Appl. No.: 17/654,271

(22) Filed: Mar. 10, 2022

(65) Prior Publication Data

US 2022/0199485 A1 Jun. 23, 2022

Related U.S. Application Data

(63) Continuation of application No. PCT/JP2020/034090, filed on Sep. 9, 2020.

(30) Foreign Application Priority Data

Sep. 13, 2019 (JP) .................................. 2019-167347

(51) Int. Cl.
*H01L 23/367* (2006.01)
*H01L 23/552* (2006.01)
*H01L 25/16* (2023.01)

(52) U.S. Cl.
CPC .......... *H01L 23/367* (2013.01); *H01L 23/552* (2013.01); *H01L 25/16* (2013.01)

(58) Field of Classification Search
None
See application file for complete search history.

(56) References Cited

U.S. PATENT DOCUMENTS

| 9,293,446 | B2* | 3/2016 | Matsumoto | H01L 25/165 |
| 10,999,957 | B2* | 5/2021 | Lee | H05K 1/0203 |
| 2010/0244059 | A1* | 9/2010 | Iida | H01L 24/19 |
| | | | | 257/E33.044 |
| 2019/0289758 | A1 | 9/2019 | Furuya | |
| 2019/0393166 | A1 | 12/2019 | Otsubo | |
| 2020/0343151 | A1* | 10/2020 | Nomura | H01L 21/56 |
| 2022/0199485 | A1* | 6/2022 | Otsubo | H05K 1/02 |

(Continued)

FOREIGN PATENT DOCUMENTS

| JP | H04-58596 A | 2/1992 |
| JP | 5273154 B2 | 5/2013 |
| JP | 5552821 B2 | 6/2014 |

(Continued)

OTHER PUBLICATIONS

International Search Report for PCT/JP2020/034090 dated Nov. 24, 2020.

*Primary Examiner* — Long Pham
(74) *Attorney, Agent, or Firm* — Pearne & Gordon LLP

(57) ABSTRACT

A module includes a substrate including a first main surface, a first component mounted on the first main surface, a first sealing resin that covers the first main surface and a portion of connection of the first component to at least the first main surface, a first conductor pattern arranged on a surface of the first sealing resin on a side distant from the first main surface, and a columnar conductor as a metal member connected to the first conductor pattern to pass through the first sealing resin from an electrode drawn from the first component along the first main surface.

20 Claims, 13 Drawing Sheets

(56) References Cited

U.S. PATENT DOCUMENTS

2022/0199540 A1* 6/2022 Singh ................. H01L 23/5226
2022/0418089 A1* 12/2022 Nomura ................ H01L 23/562

FOREIGN PATENT DOCUMENTS

| JP | 2018-088460 A | 6/2018 |
|----|---------------|--------|
| WO | 2018/110397 A1 | 6/2018 |
| WO | 2018/164158 A1 | 9/2018 |
| WO | 2019/138895 A1 | 7/2019 |

* cited by examiner

MODULE

CROSS REFERENCE TO RELATED APPLICATIONS

This is a continuation of International Application No. PCT/JP2020/034090 filed on Sep. 9, 2020 which claims priority from Japanese Patent Application No. 2019-167347 filed on Sep. 13, 2019. The contents of these applications are incorporated herein by reference in their entireties.

FIELD OF THE DISCLOSURE

The present disclosure relates to a module.

DESCRIPTION OF THE RELATED ART

Japanese Patent Laying-Open No. 2018-88460 (PTL 1) describes a configuration of a module provided with a shield layer for shielding an electronic component arranged on an inner side of a sealing resin layer. FIG. 10 of PTL 1 shows the configuration in which electronic components are mounted on opposing surfaces of a wiring board. The sealing resin layer is formed to seal an electronic component also on a lower surface of the wiring board and the shield layer is formed on the lower surface of the sealing resin layer.

PTL 1: Japanese Patent Laying-Open No. 2018-88460

BRIEF SUMMARY OF THE DISCLOSURE

In the configuration shown in FIG. 10 of PTL 1, heat is radiated from the shield layer. Therefore, in order to radiate heat generated from a circuit surface of the electronic component, heat should conduct from the circuit surface to the shield layer. The circuit surface of the electronic component, however, is isolated by the sealing resin from the shield layer on the lower surface of the sealing resin layer, and heat radiation performance is insufficient. In other words, in the configuration shown in FIG. 10 of PTL 1, heat generated in the circuit surface of the electronic component is less likely to conduct to the shield layer.

An object of the present disclosure is to provide a module capable of satisfactorily radiating heat also from a component mounted on a lower surface of a substrate.

In order to achieve the object above, a module based on the present disclosure includes a substrate including a first main surface, a first component mounted on the first main surface, a first sealing resin that covers the first main surface and a portion of connection of the first component to at least the first main surface, a first conductor pattern arranged on a surface of the first sealing resin on a side distant from the first main surface, and a metal member connected to the first conductor pattern to pass through the first sealing resin from an electrode drawn from the first component along the first main surface.

According to the present disclosure, heat generated in a first component can efficiently conduct to the first conductor pattern through the electrode drawn along the first main surface and further through the metal member. Therefore, heat generated in the first component can efficiently be radiated.

DETAILED DESCRIPTION OF THE DISCLOSURE

Figure 1:
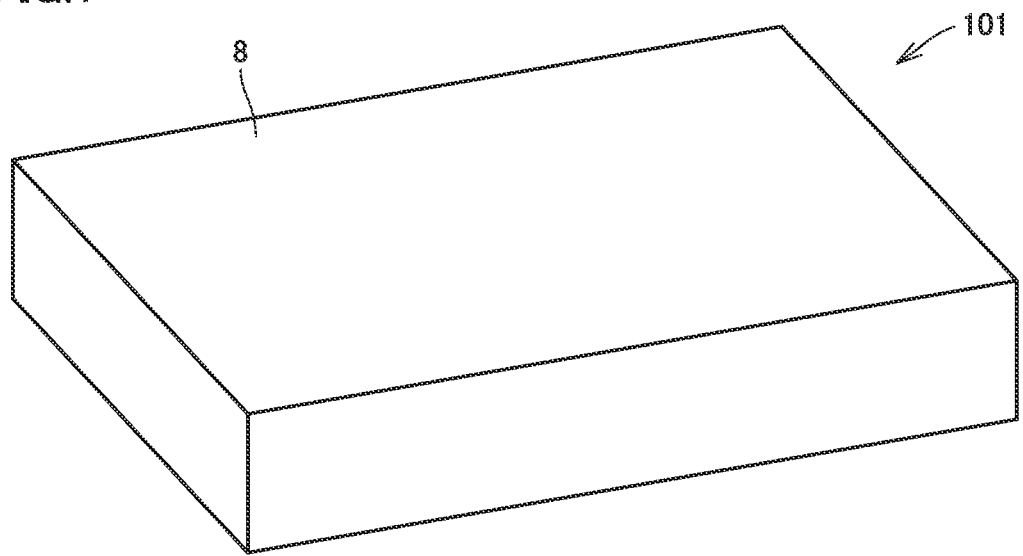
FIG. 1 is a perspective view of a module in a first embodiment based on the present disclosure.

A dimensional ratio shown in the drawings does not necessarily faithfully represent an actual dimensional ratio and a dimensional ratio may be exaggerated for the sake of convenience of description. A concept up or upper or down or lower mentioned in the description below does not mean absolute up or upper or down or lower but may mean relative up or upper or down or lower in terms of a shown position.

First Embodiment

Figure 2:
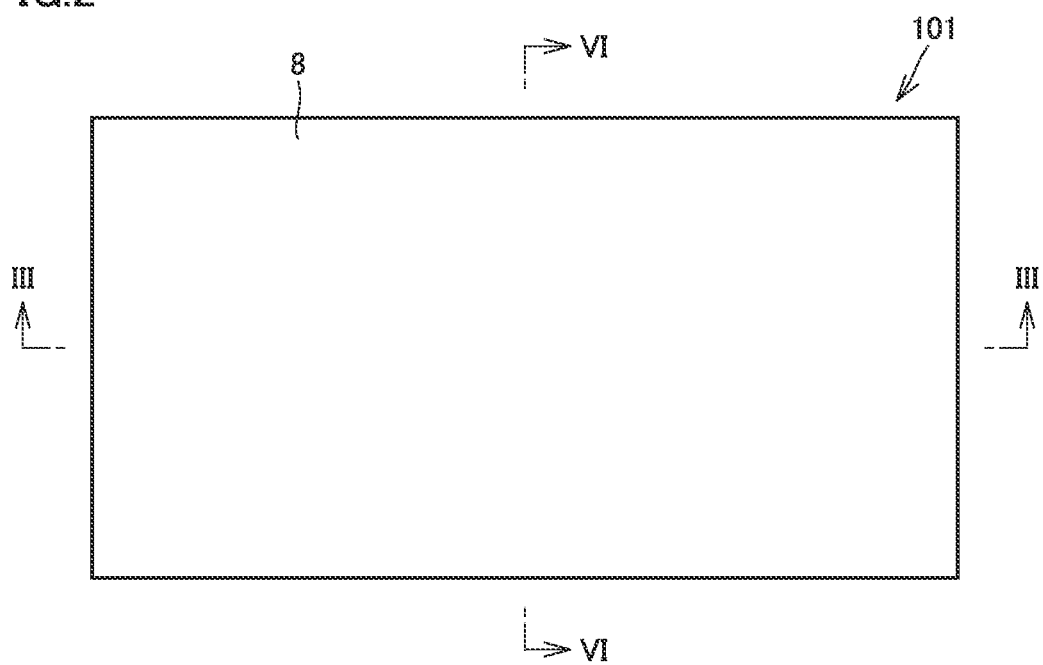
FIG. 2 is a plan view of the module in the first embodiment based on the present disclosure.
Figure 3:
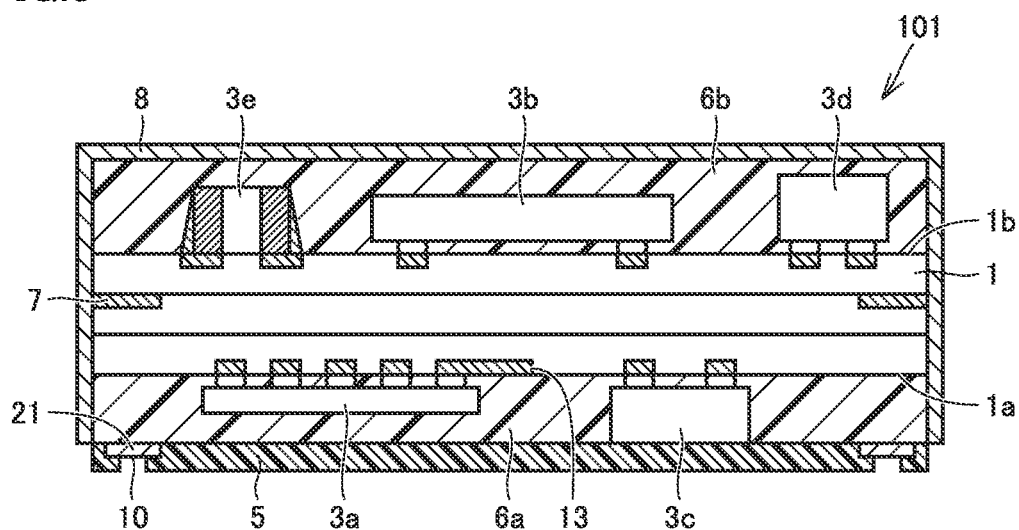
FIG. 3 is a cross-sectional view along the line III-III in FIG. 2.
Figure 4:
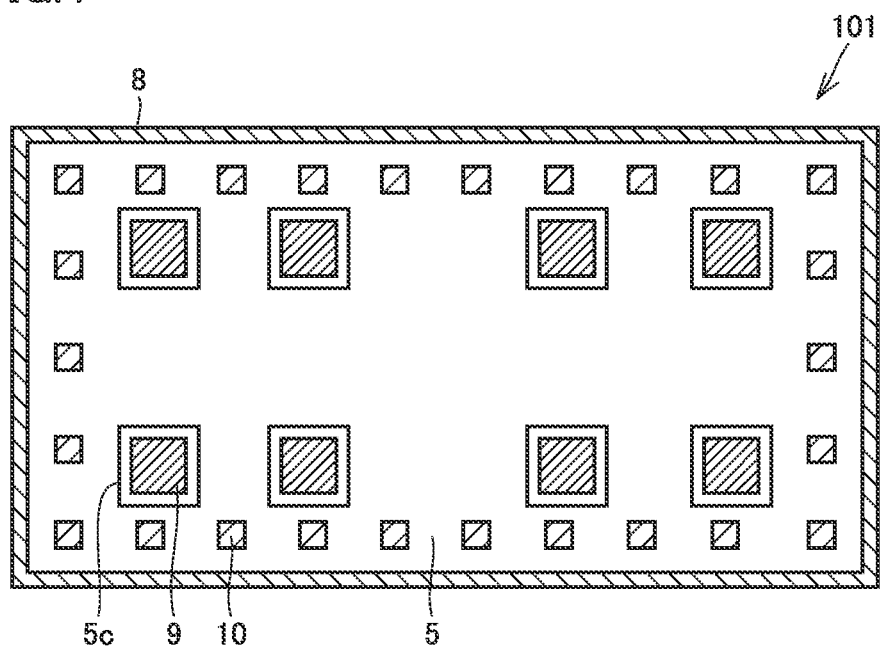
FIG. 4 is a bottom view of the module in the first embodiment based on the present disclosure.

A module in a first embodiment based on the present disclosure will be described with reference to FIGS. 1 to 6. FIG. 1 shows a perspective view of a module 101 in the present embodiment. FIG. 2 shows a plan view of module 101. FIG. 3 shows a cross-sectional view along the line III-III in FIG. 2. For the sake of convenience of illustration, FIG. 3 shows also at the same time, a component in such positional relation that it basically does not appear in the same cross-section. This is also applicable to other cross-sectional views below. FIG. 4 shows a bottom view of module 101.

Module 101 includes a substrate 1 including a first main surface 1a, a first component 3a mounted on first main surface 1a, a first sealing resin 6a that covers first main surface 1a and a portion of connection of first component 3a to at least first main surface 1a, a first conductor pattern 21 arranged on a surface of first sealing resin 6a on a side distant from first main surface 1a, and a columnar conductor 14 as a metal member connected to first conductor pattern 21 to pass through first sealing resin 6a from an electrode drawn from first component 3a along first main surface 1a.

Substrate 1 includes a second main surface 1b on a side opposite to first main surface 1a. Module 101 includes a second component 3b mounted on second main surface 1b and a second sealing resin 6b that covers second main surface 1b and second component 3b.

Substrate 1 is a wiring board. Substrate 1 is, for example, a ceramic multilayer substrate. Substrate 1 may be a resin substrate. An interconnection may be provided on a surface and in the inside of substrate 1.

As shown in FIG. 4, most of a lower surface of module 101 is covered with a resist film 5. A plurality of openings are provided in resist film 5. A conductor is exposed through the openings disposed in an outer peripheral portion to be a heat radiation exposed portion 10. In a central region surrounded by heat radiation exposed portions 10, some openings 5c different in size from heat radiation exposed portion 10 are provided, and external connection terminals 9 are exposed through these openings 5c. Though eight square external connection terminals 9 are shown, a shape, a size, the number, and arrangement of external connection terminals 9 shown here are by way of example, and they are not necessarily as such.

Figure 5:
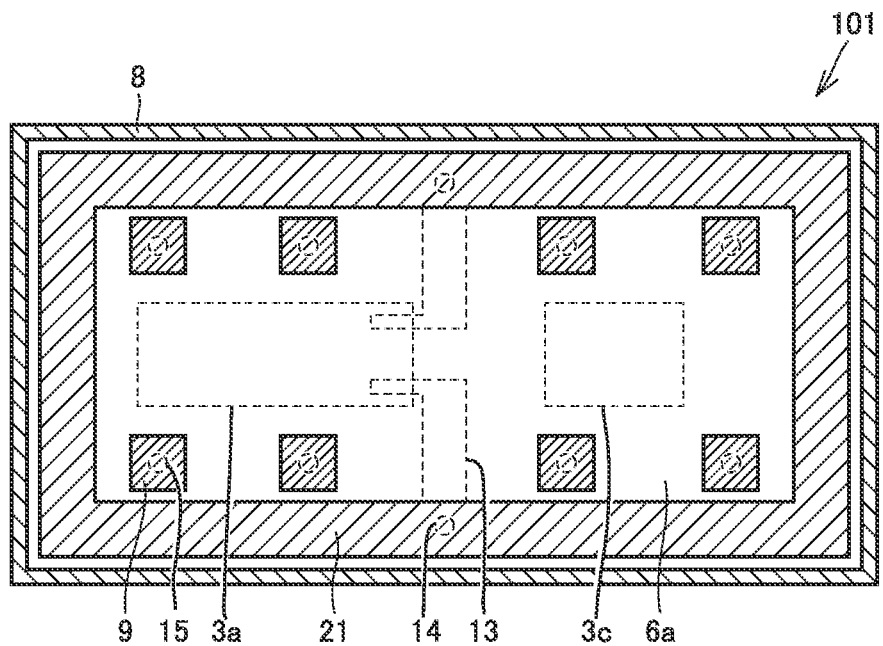
FIG. 5 is a bottom view with a resist film having been removed from a lower surface of the module in the first embodiment based on the present disclosure.

FIG. 5 shows a bottom view with resist film 5 having been removed. First conductor pattern 21 is arranged in the outer peripheral portion on the lower surface of first sealing resin 6a. In the example shown here, first conductor pattern 21 is a conductor pattern in a form of a frame. What is exposed as heat radiation exposed portion 10 is a part of first conductor pattern 21. First component 3a and a component 3c are hidden behind first sealing resin 6a. A columnar conductor 15 is hidden behind external connection terminal 9.

Figure 6:
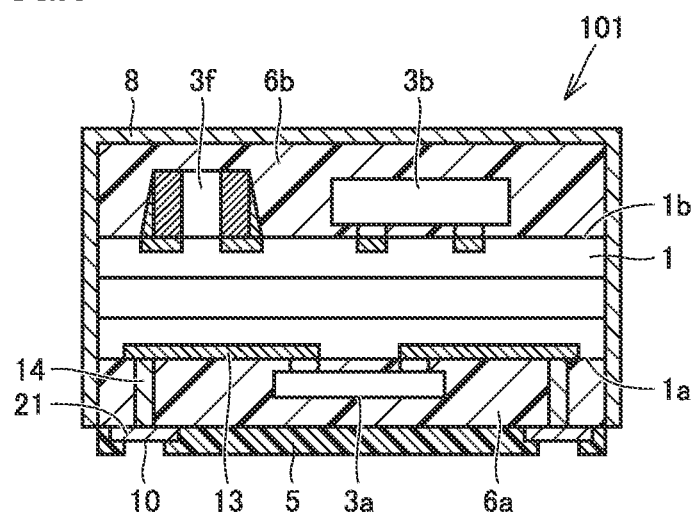
FIG. 6 is a cross-sectional view along the line VI-VI in FIG. 2.

FIG. 6 shows a cross-sectional view along the line VI-VI in FIG. 2. First component 3a is mounted on first main surface 1a with some connection portions being interposed. An electrode 13 is drawn along first main surface 1a from at least one of the connection portions. Electrode 13 has a tip end connected to first conductor pattern 21 through columnar conductor 14. Columnar conductor 14 is arranged to pass through first sealing resin 6a.

Components 3d, 3e, and 3f other than second component 3b are mounted on second main surface 1b. Second sealing resin 6b is formed to cover all components mounted on second main surface 1b. A shield film 8 is formed to cover an upper surface and a side surface of second sealing resin 6b, a side surface of substrate 1, and a side surface of first sealing resin 6a. Shield film 8 is a conductive film. Shield film 8 is, for example, a metal film. Shield film 8 may be formed, for example, by sputtering. Shield film 8 is electrically connected to a conductor pattern 7 arranged in the inside of substrate 1. Conductor pattern 7 is a ground electrode. Conductor pattern 7 is exposed at the side surface of substrate 1.

In the present embodiment, heat generated in first component 3a mounted on first main surface 1a can efficiently conduct to first conductor pattern 21 through electrode 13 drawn along first main surface 1a and further through columnar conductor 14 as the metal member. First conductor pattern 21 is arranged on the surface of first sealing resin 6a on the side distant from first main surface 1a. Therefore, heat can satisfactorily be radiated also from a component mounted on first main surface 1a which is the lower surface of substrate 1. In particular, when first component 3a is an IC, the circuit surface where heat is generated is located in the vicinity of the surface on the substrate 1 side of first component 3a. At this time, generated heat tends to be trapped between substrate 1 and first component 3a. In contrast, in the configuration described in the present embodiment, heat can be radiated by conduction of heat from the electrode provided on a heat generation side to the first conductor pattern. Therefore, a module higher in heat radiation performance can be provided.

Electrode 13 is preferably a ground electrode. By adopting this configuration, heat radiation can be accelerated by using the ground electrode of first component 3a. When electrode 13 is the ground electrode, first conductor pattern 21 is also the ground electrode.

As shown in the present embodiment, in a plan view, first conductor pattern 21 is preferably in a form of a frame. By adopting this configuration, heat radiation can be accelerated in the outer peripheral portion of the lower surface while a central portion of the lower surface of the module is reserved for another application. By providing the first conductor pattern in a form of a frame, the first conductor pattern can readily be arranged in a region which is not within a region of projection of a component which is a heat generation source. Therefore, local temperature increase in the module can be avoided and a temperature distribution can be uniform as much as possible. By avoiding local temperature increase in the module, separation or distortion between layers of the module, for example, between a sealing resin layer and a wiring board, between a heat generating component and a sealing resin, or between a heat generating component and a wiring board can be lessened and reliability can be improved.

Columnar conductor 14 is shown as an exemplary metal member connected to first conductor pattern 21 to pass through first sealing resin 6a from electrode 13. The metal member preferably includes columnar conductor 14. By adopting this configuration, electrical connection of a desired thickness can be established in a desired region. The metal member, however, is not limited to columnar conductor 14. The metal member may be, for example, a wire as will be described later. The metal member may be a pin, a block, or a plated film.

Though an example in which resist film 5 is provided on the lower surface of the module is shown, presence of resist film 5 is not essential. A configuration without resist film 5 on the lower surface may be applicable. By providing resist film 5 on the lower surface of the module and permitting only local exposure, solder can be prevented from flowing to an undesired region in mounting the module on a mother board. Therefore, soldering to the mother board can satisfactorily be achieved. Presence of resist film 5 is not essential either in embodiments below.

As shown in the present embodiment, shield film 8 arranged to cover the surface of second sealing resin 6b on the side distant from second main surface 1b and the side surface of second sealing resin 6b, the side surface of substrate 1, and the side surface of first sealing resin 6a is preferably provided. By adopting this configuration, an external electromagnetic wave can be cut off.

Second Embodiment

Figure 7:
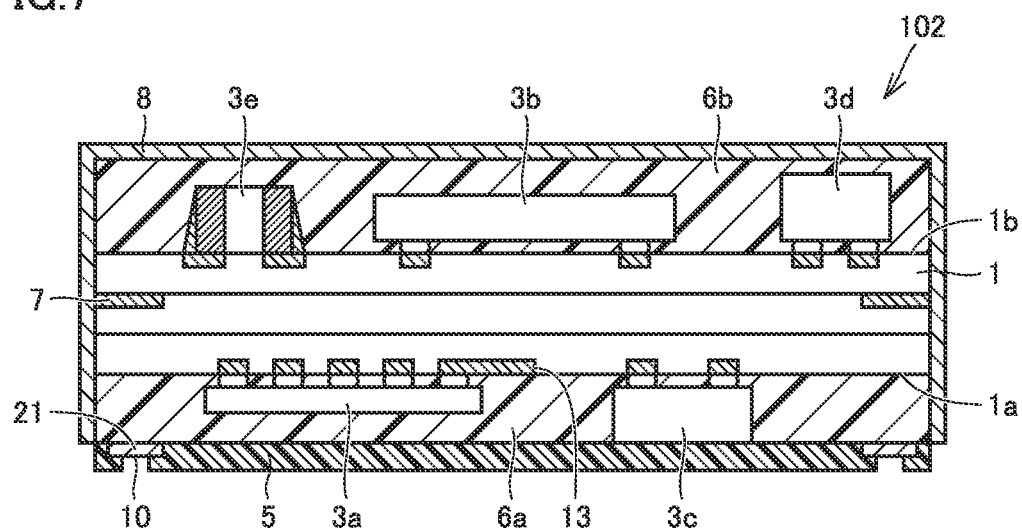
FIG. 7 is a first cross-sectional view of a module in a second embodiment based on the present disclosure.
Figure 8:
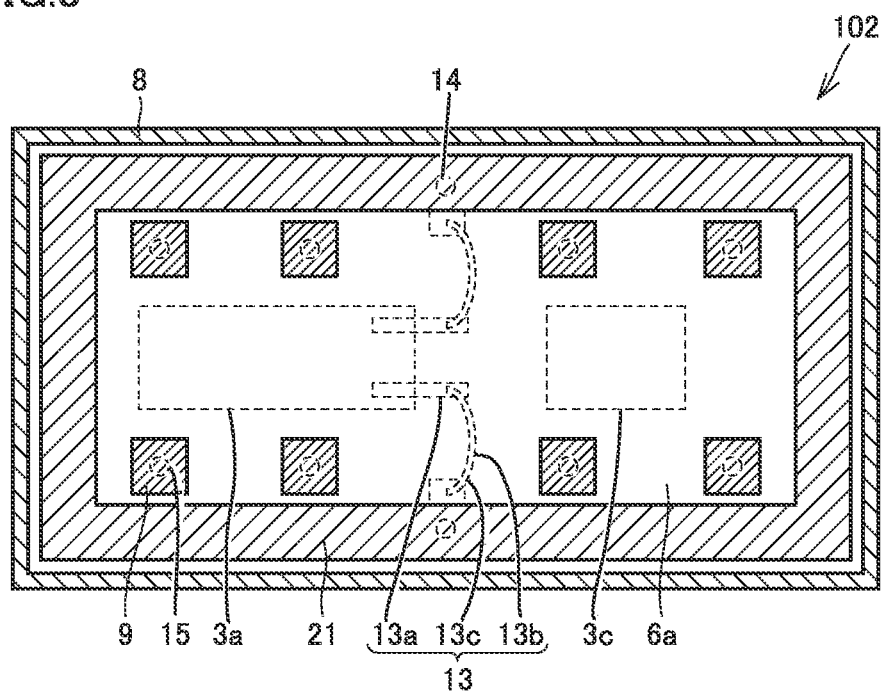
FIG. 8 is a bottom view with a resist film having been removed from the lower surface of the module in the second embodiment based on the present disclosure.
Figure 9:
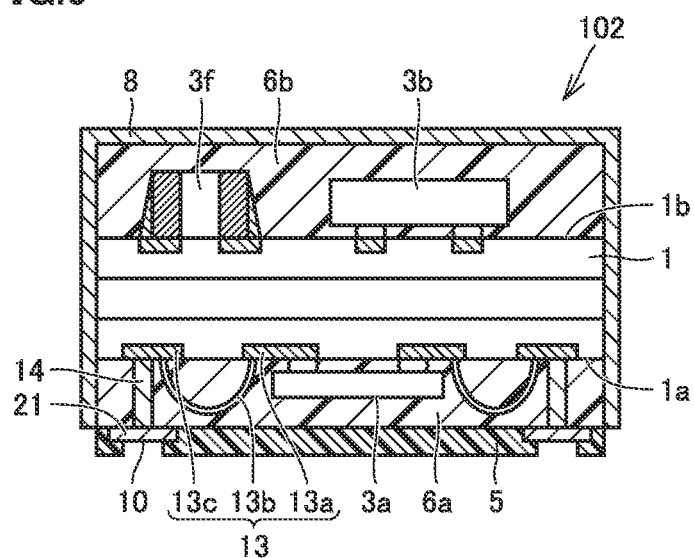
FIG. 9 is a second cross-sectional view of the module in the second embodiment based on the present disclosure.

A module in a second embodiment based on the present disclosure will be described with reference to FIGS. 7 to 9. FIG. 7 shows a cross-sectional view of a module 102 in the present embodiment. FIG. 8 shows a bottom view of module 102 with resist film 5 having been removed. FIG. 9 shows a cross-sectional view of module 102 when viewed in a direction different from a direction in FIG. 7.

Though module 102 is basically similar in configuration to module 101 shown in the first embodiment, module 102 is different in structure of electrode 13 drawn from first component 3a along first main surface 1a. Electrode 13 includes an electrode segment 13a, a wire 13b, and an electrode segment 13c. Wire 13b electrically connects electrode segment 13a and electrode segment 13c to each other. Columnar conductor 14 as the metal member is electrically connected to electrode segment 13c. Columnar conductor 14 passes through first sealing resin 6a. Columnar conductor 14 electrically connects electrode segment 13c and first conductor pattern 21 to each other. Electrode 13 connected to first conductor pattern 21 is preferably the ground electrode. By adopting this configuration, heat radiation can be accelerated by using the ground electrode of first component 3a. When electrode 13 is the ground electrode, first conductor pattern 21 is also the ground electrode.

The present embodiment can also achieve an effect similar to that in the first embodiment. In the present embodiment, electrode 13 includes wire 13b. Therefore, a path through which heat generated in first component 3a conducts can be distant from substrate 1. A degree of conduction of heat to substrate 1 can thus be lowered. Consequently, heat trapped in the inside of the module can be suppressed. Since another component can be mounted between electrode 13 and columnar conductor 14, a density in mounting can be increased.

Third Embodiment

Figure 10:
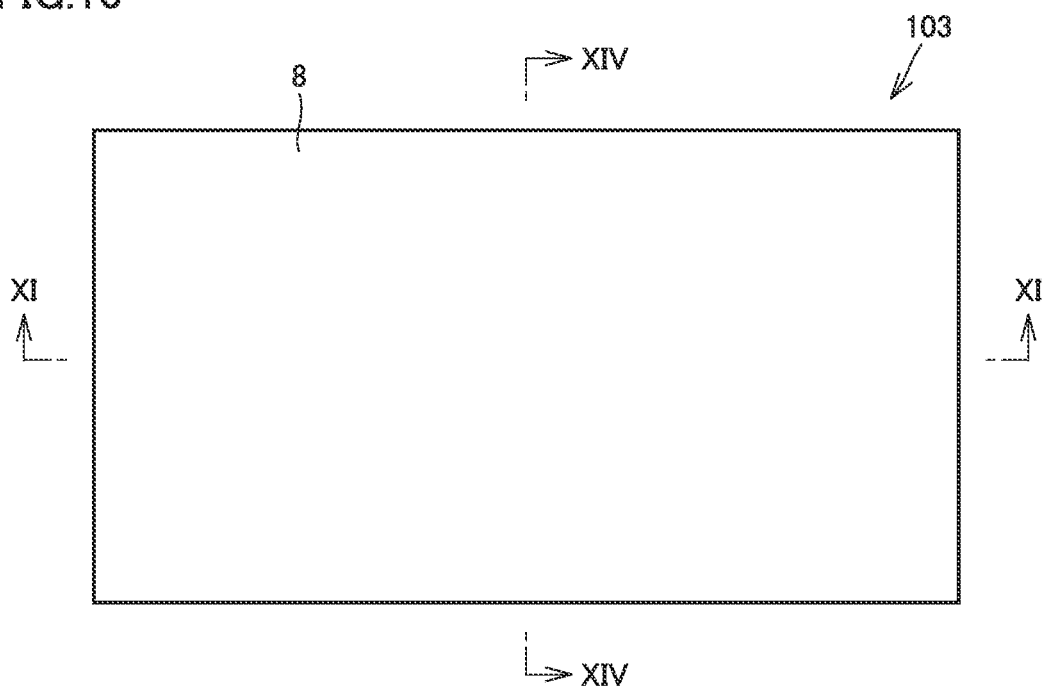
FIG. 10 is a plan view of a module in a third embodiment based on the present disclosure.
Figure 11:
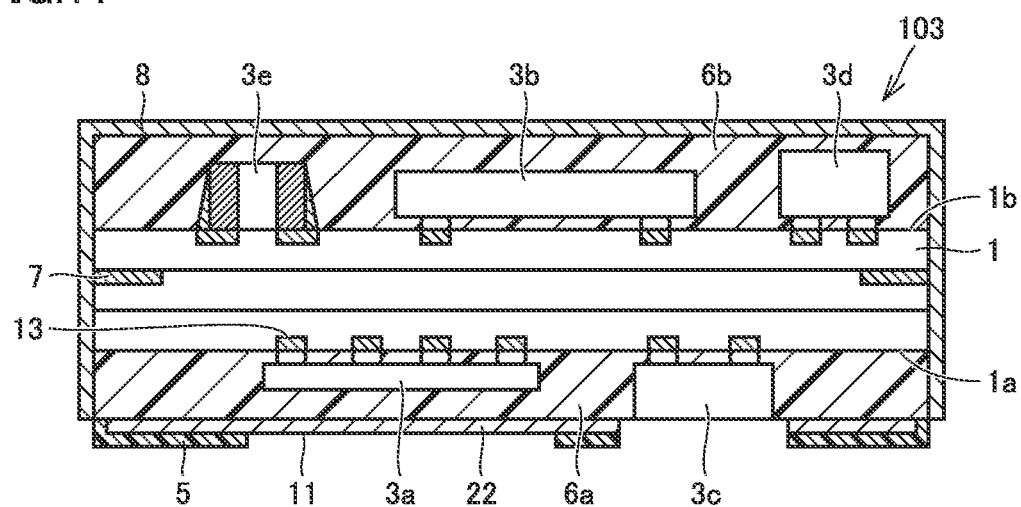
FIG. 11 is a cross-sectional view along the line XI-XI in FIG. 10.
Figure 12:
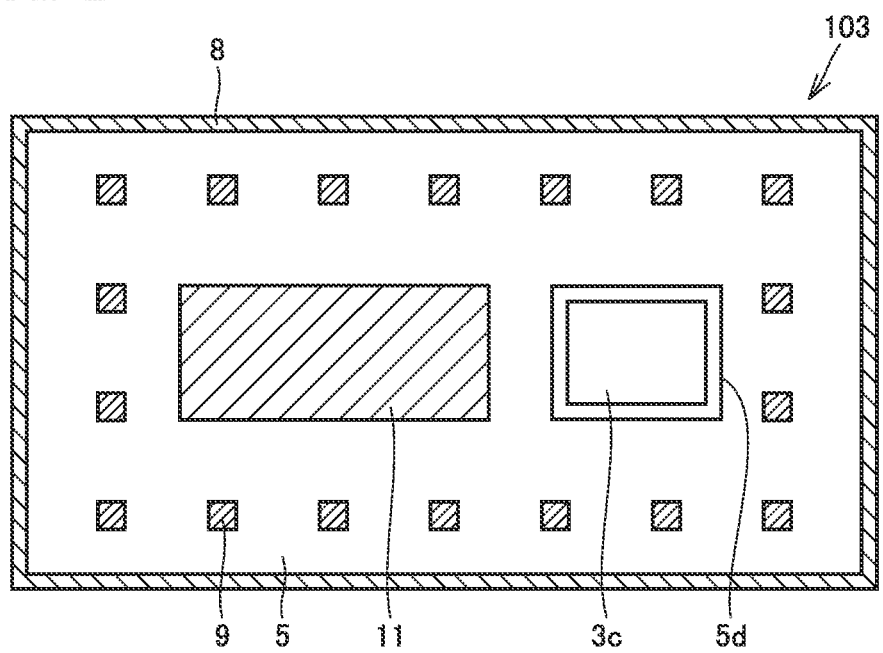
FIG. 12 is a bottom view of the module in the third embodiment based on the present disclosure.
Figure 13:
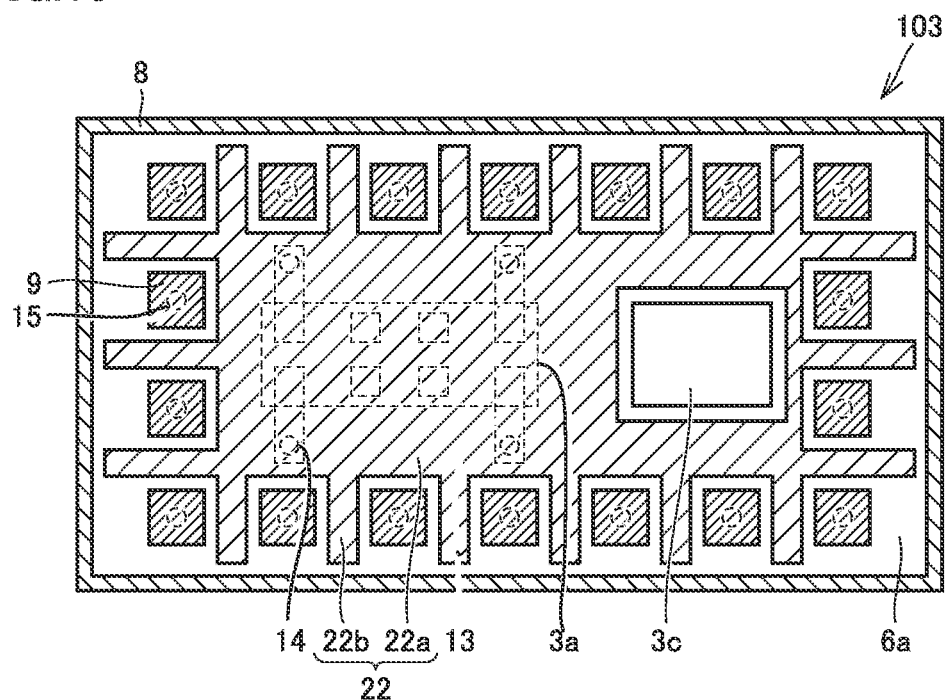
FIG. 13 is a bottom view with the resist film having been removed from the lower surface of the module in the third embodiment based on the present disclosure.
Figure 14:
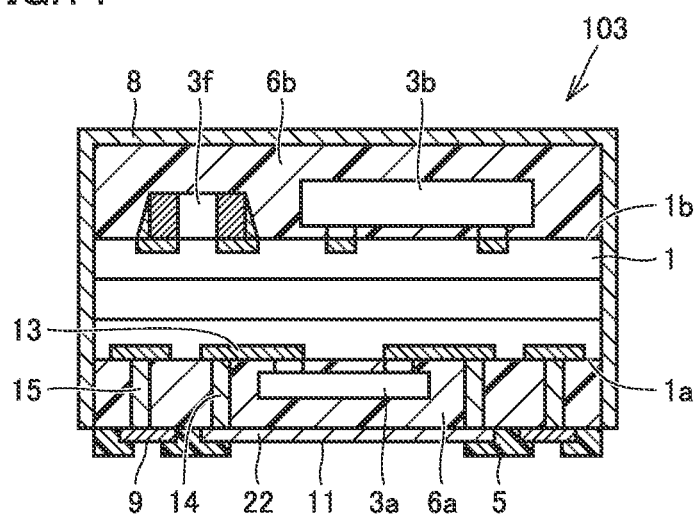
FIG. 14 is a cross-sectional view along the line XIV-XIV in FIG. 10.

A module in a third embodiment based on the present disclosure will be described with reference to FIGS. 10 to 14. FIG. 10 shows a plan view of a module 103 in the present embodiment. FIG. 11 shows a cross-sectional view along the line XI-XI in FIG. 10. FIG. 12 shows a bottom view of module 103. Most of the lower surface of module 103 is covered with resist film 5. Component 3c is exposed through an opening 5d in resist film 5. The lower surface of component 3c is exposed without being covered with first sealing resin 6a. FIG. 13 shows a bottom view with resist film 5 having been removed. FIG. 14 shows a cross-sectional view along the line XIV-XIV in FIG. 10.

Though module 103 is basically similar in configuration to module 101 shown in the first embodiment, it is different in arrangement of external connection terminal 9. In module 103, a first conductor pattern 22 is arranged instead of first conductor pattern 21. First conductor pattern 22 is significantly different in shape from first conductor pattern 21. First conductor pattern 22 includes a main body portion 22a and a protruding portion 22b.

On the surface of first sealing resin 6a on the side distant from substrate 1, a plurality of external connection terminals 9 are disposed in the outer peripheral portion. First conductor pattern 22 is arranged such that at least a part of first conductor pattern 22 is arranged in an inner region surrounded by the plurality of external connection terminals 9. As shown in FIGS. 11 and 12, a central portion of first conductor pattern 22 is exposed through an opening provided in resist film 5. This exposed portion is a heat radiation exposed portion 11. Electrode 13 connected to first conductor pattern 22 is preferably the ground electrode. By adopting this configuration, heat radiation can be accelerated by using the ground electrode of first component 3a. When electrode 13 is the ground electrode, first conductor pattern 22 is also the ground electrode.

The present embodiment can also achieve an effect similar to that in the first embodiment. In the present embodiment, the inner region surrounded by the plurality of external connection terminals 9 can effectively be used to accelerate heat radiation.

As shown in the present embodiment, first conductor pattern 22 preferably includes main body portion 22a arranged in the inner region and protruding portion 22 that extends from main body portion 22a to lie between external connection terminals 9. By adopting this configuration, protruding portion 22b can be arranged also in a region between external connection terminals 9 and hence an area of the conductor for heat radiation can be increased while a space is effectively used.

As shown in the present embodiment, first conductor pattern 22 preferably extends to cover the entirety except for a region where the plurality of external connection terminals 9 are located and a region where a mounted component mounted on first main surface 1a is exposed through first sealing resin 6a, in the surface of first sealing resin 6a on the side distant from substrate 1. By adopting this configuration, an area of the conductor for heat radiation can be increased while a space is effectively used.

Fourth Embodiment

Figure 15:
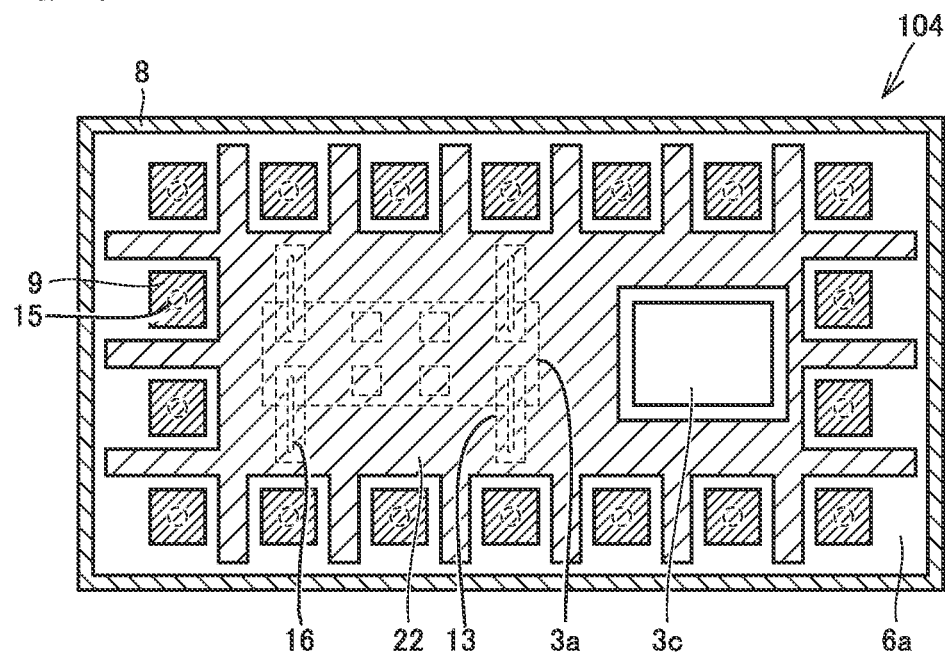
FIG. 15 is a bottom view with the resist film having been removed from the lower surface of a module in a fourth embodiment based on the present disclosure.
Figure 16:
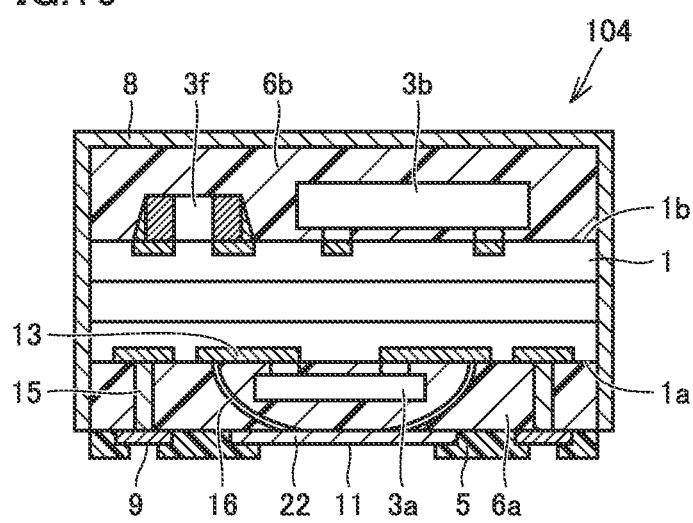
FIG. 16 is a cross-sectional view of the module in the fourth embodiment based on the present disclosure.

A module in a fourth embodiment based on the present disclosure will be described with reference to FIGS. 15 to 16. FIG. 15 shows a bottom view with resist film 5 on the lower surface of a module 104 having been removed. FIG. 16 shows a cross-sectional view of module 104.

Module 104 includes a wire 16 as the metal member connected to first conductor pattern 22 to pass through first sealing resin 6a from electrode 13 drawn from first component 3a along first main surface 1a. The metal member preferably includes wire 16.

Wire 16 is arranged to straddle first component 3a. Wire 16 may be in a form of a single arch, or may be arranged to be in a form of a single arch and thereafter divided into two parts by removal of a top portion by polishing or the like. In the example shown in FIG. 16, wire 16 is divided into left and right parts. Electrode 13 connected to first conductor pattern 22 is preferably the ground electrode. By adopting this configuration, heat radiation can be accelerated by using the ground electrode of first component 3a. When electrode 13 is the ground electrode, first conductor pattern 22 is also the ground electrode.

In the present embodiment, wire 16 is used as the metal member connected to first conductor pattern 22 to pass through first sealing resin 6a from electrode 13. Therefore, a heat radiation path can be formed in a limited space with the use of a wire bonding technique.

As shown in the present embodiment, wire 16 is preferably arranged to straddle first component 3a. By adopting this configuration, connection to the first conductor pattern can be established while a space is effectively used.

Fifth Embodiment

Figure 17:
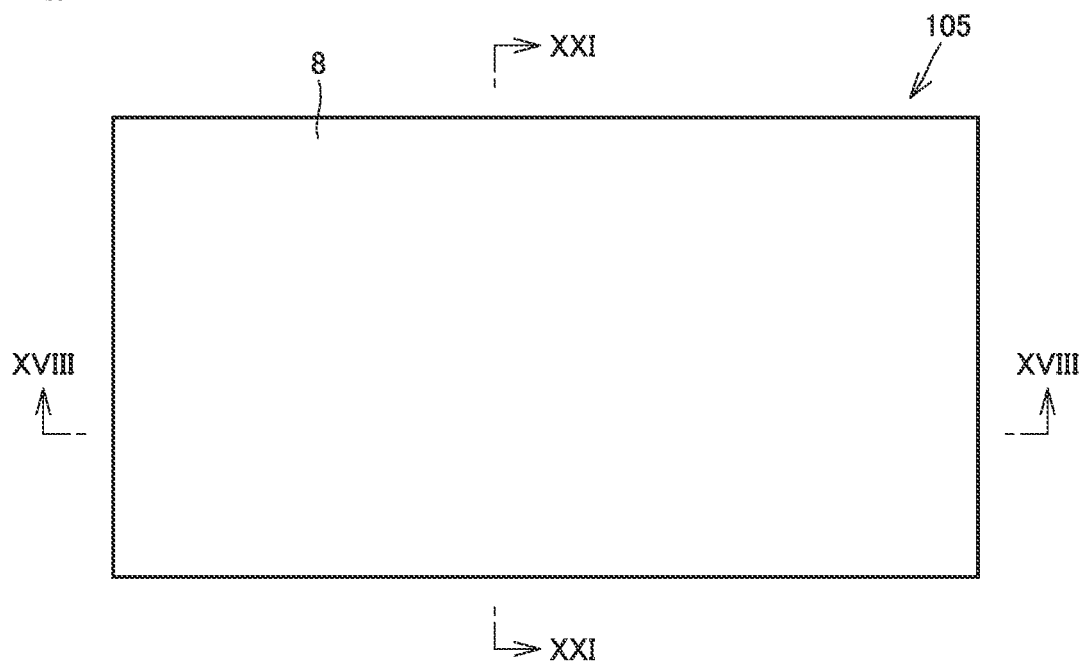
FIG. 17 is a plan view of a module in a fifth embodiment based on the present disclosure.
Figure 18:
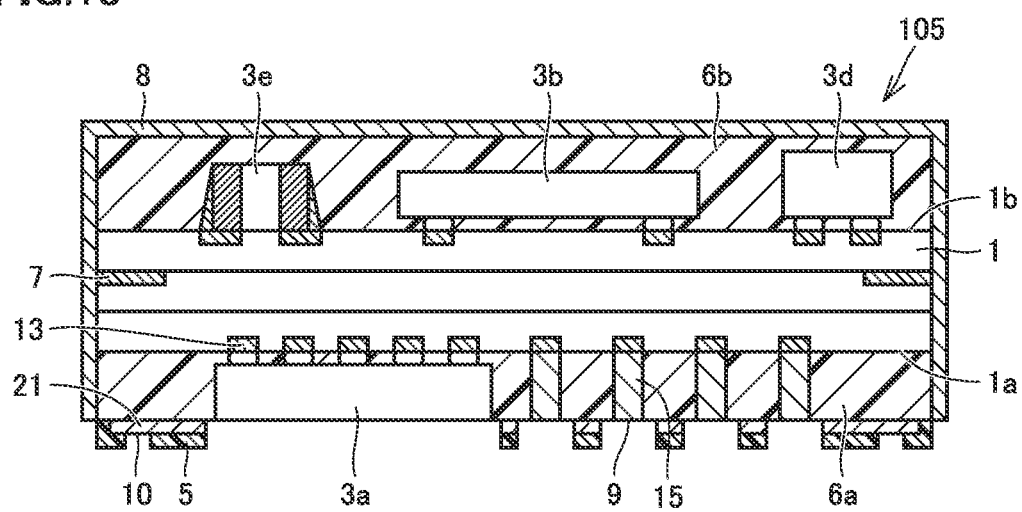
FIG. 18 is a cross-sectional view along the line XVIII-XVIII in FIG. 17.
Figure 19:
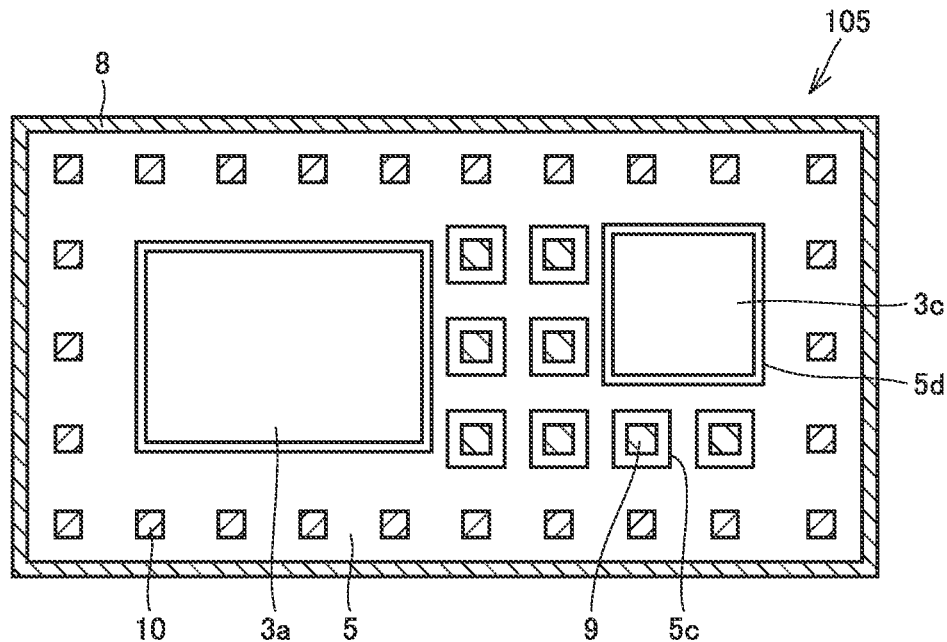
FIG. 19 is a bottom view of the module in the fifth embodiment based on the present disclosure.
Figure 20:
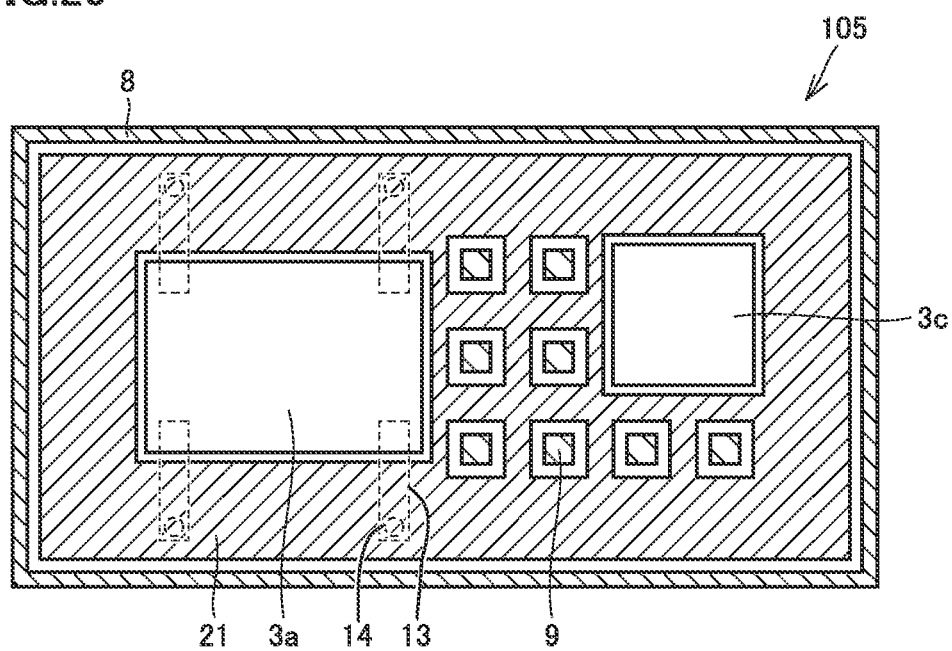
FIG. 20 is a bottom view with the resist film having been removed from the lower surface of the module in the fifth embodiment based on the present disclosure.
Figure 21:
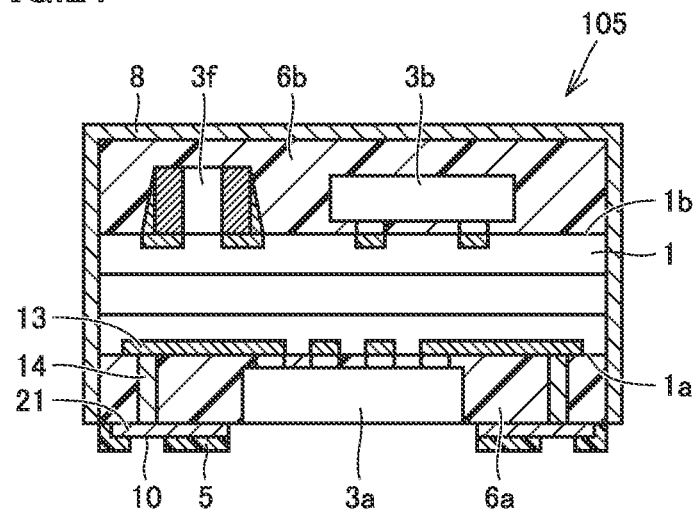
FIG. 21 is a cross-sectional view along the line XXI-XXI in FIG. 17.

A module in a fifth embodiment based on the present disclosure will be described with reference to FIGS. 17 to 21. FIG. 17 shows a plan view of a module 105. FIG. 18 shows a cross-sectional view along the line XVIII-XVIII in FIG. 17. FIG. 19 shows a bottom view of module 105. FIG. 20 shows a bottom view with resist film 5 on the lower surface of module 105 having been removed. FIG. 21 shows a cross-sectional view along the line XXI-XXI in FIG. 17.

In module 105, the surface of first component 3a on the side distant from first main surface 1a is exposed through first sealing resin 6a. Electrode 13 connected to first conductor pattern 21 is preferably the ground electrode. By adopting this configuration, heat radiation can be accelerated by using the ground electrode of first component 3a. When electrode 13 is the ground electrode, first conductor pattern 21 is also the ground electrode.

In the present embodiment, the surface of first component 3a on the side distant from first main surface 1a is exposed through first sealing resin 6a. Therefore, heat generated in first component 3a is radiated through electrode 13, columnar conductor 14, and first conductor pattern 21, and in addition, may be emitted to the outside also from the surface of first component 3a on the side distant from first main surface 1a. Therefore, heat can more efficiently be radiated.

Sixth Embodiment

Figure 22:
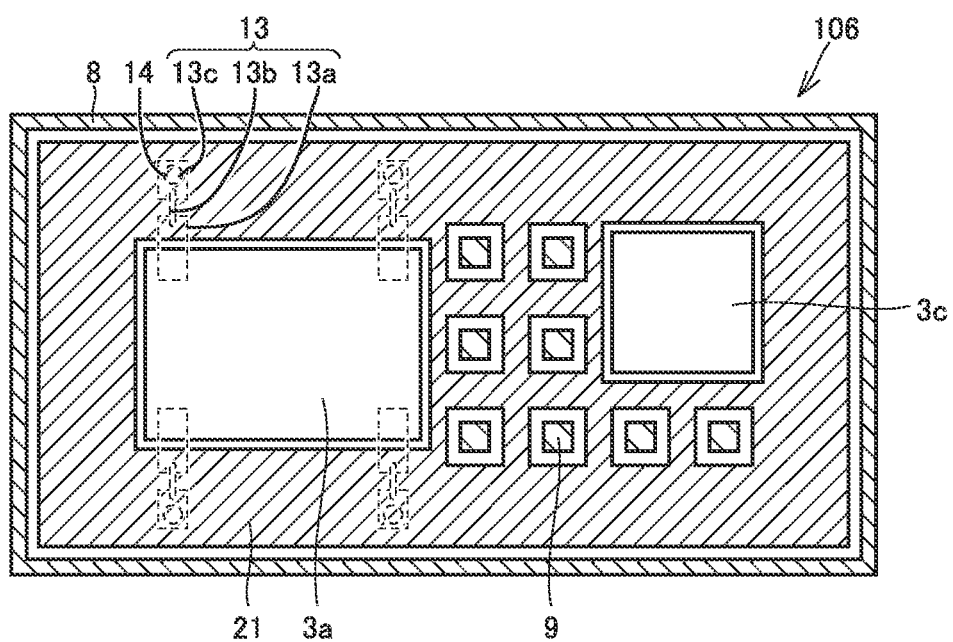
FIG. 22 is a bottom view with the resist film having been removed from the lower surface of a module in a sixth embodiment based on the present disclosure.
Figure 23:
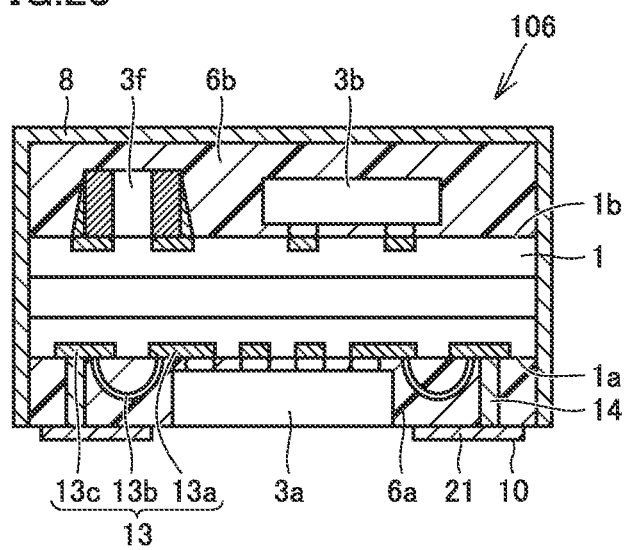
FIG. 23 is a cross-sectional view of the module in the sixth embodiment based on the present disclosure.

A module in a sixth embodiment based on the present disclosure will be described with reference to FIGS. 22 to 23. FIG. 22 shows a bottom view with resist film 5 on the lower surface of a module 106 having been removed. FIG. 23 shows a cross-sectional view of module 106.

In module 106, electrode 13 includes electrode segment 13a, wire 13b, and electrode segment 13c. Wire 13b electrically connects electrode segment 13a and electrode segment 13c to each other. Columnar conductor 14 as the metal member is electrically connected to electrode segment 13c. Columnar conductor 14 passes through first sealing resin 6a. Columnar conductor 14 electrically connects electrode segment 13c and first conductor pattern 21 to each other. Electrode 13 connected to first conductor pattern 21 is preferably the ground electrode. By adopting this configuration, heat radiation can be accelerated by using the ground electrode of first component 3a. When electrode 13 is the ground electrode, first conductor pattern 21 is also the ground electrode.

The present embodiment can also achieve an effect similar to that in the fifth embodiment. In the present embodiment, electrode 13 includes wire 13b. Since heat conducts through wire 13b, a heat conduction path can be distant from substrate 1. A degree of conduction of heat to substrate 1 can thus be lowered. Since another component can be mounted between electrode segment 13a and electrode segment 13c, a density in mounting can be increased.

Seventh Embodiment

Figure 24:
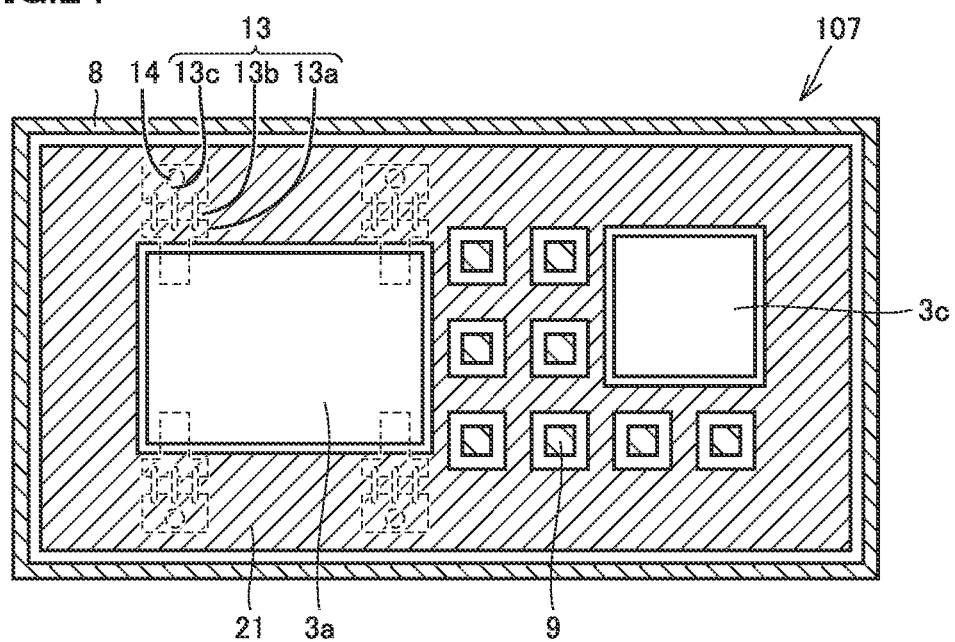
FIG. 24 is a bottom view with the resist film having been removed from the lower surface of a module in a seventh embodiment based on the present disclosure.
Figure 25:
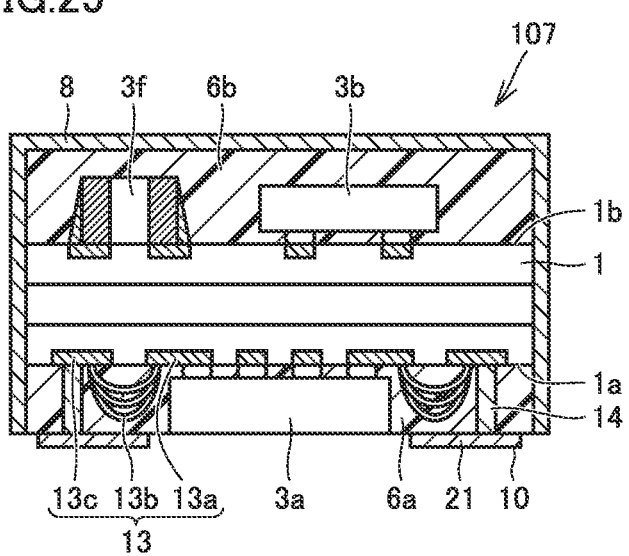
FIG. 25 is a cross-sectional view of the module in the seventh embodiment based on the present disclosure.

A module in a seventh embodiment based on the present disclosure will be described with reference to FIGS. 24 to 25. FIG. 24 shows a bottom view with resist film 5 on the lower surface of a module 107 having been removed. FIG. 25 shows a cross-sectional view of module 107.

In module 107, electrode 13 includes electrode segment 13a, a plurality of wires 13b, and electrode segment 13c. In the example shown in FIG. 24, three wires 13b are arranged to electrically connect single electrode segment 13a and single electrode segment 13c to each other. Three wires 13b are arranged in parallel. For the sake of convenience of illustration, FIG. 25 shows as being displaced, three wires 13b that are essentially aligned in a depth direction on the sheet plane. Electrode 13 connected to first conductor pattern 21 is preferably the ground electrode. By adopting this configuration, heat radiation can be accelerated by using the ground electrode of first component 3a. When electrode 13 is the ground electrode, first conductor pattern 21 is also the ground electrode.

The present embodiment can also achieve an effect similar to that in the sixth embodiment. Since a plurality of wires 13b are arranged in parallel in electrically connecting electrode segment 13a and electrode segment 13c to each other, the number of heat conduction paths increases and consequently heat more readily conducts.

Some features in embodiments above may be adopted as being combined as appropriate.

The embodiments disclosed herein are illustrative and non-restrictive in every respect. The scope of the present disclosure is defined by the terms of the claims and is intended to include any modifications within the scope and meaning equivalent to the terms of the claims.

1 substrate; 1a first main surface; 1b second main surface; 3a first component; 3b second component; 3c, 3d, 3e, 3f component; 5 resist film; 5c, 5d opening; 6a first sealing resin; 6b second sealing resin; 7 conductor pattern; 8 shield film; 9 external connection terminal; 10, 11 heat radiation exposed portion; 13 electrode; 13a, 13c electrode segment; 13b wire; 14, 15 columnar conductor; 16 wire; 21, 22 first conductor pattern; 22a main body portion; 22b protruding portion; 101, 102, 103, 104, 105, 106, 107 module

The invention claimed is:
1. A module comprising:
a substrate including a first main surface;
a first component mounted on the first main surface;
a first sealing resin covering the first main surface and a portion of connection of the first component to at least the first main surface;
a first conductor pattern arranged on a surface of the first sealing resin on a side distant from the first main surface, wherein a portion of the first conductor pattern is exposed to an outside of the module; and
a metal member connected to the first conductor pattern to pass through the first sealing resin from an electrode drawn from the first component along the first main surface.

2. A module comprising:
a substrate including a first main surface and a second main surface on a side opposite to the first main surface;
a first component mounted on the first main surface;

a first sealing resin covering the first main surface and a portion of connection of the first component to at least the first main surface;

a first conductor pattern arranged on a surface of the first sealing resin on a side distant from the first main surface;

a metal member connected to the first conductor pattern to pass through the first sealing resin from an electrode drawn from the first component along the first main surface;

a second component mounted on the second main surface; and a second sealing resin covering the second main surface and the second component.

3. The module according to claim 1, wherein
the electrode is a ground electrode.

4. The module according to claim 1, wherein
the first conductor pattern is in a form of a frame in a plan view.

5. A module comprising:
a substrate including a first main surface;
a first component mounted on the first main surface;
a first sealing resin covering the first main surface and a portion of connection of the first component to at least the first main surface;
a first conductor pattern arranged on a surface of the first sealing resin on a side distant from the first main surface; and
a metal member connected to the first conductor pattern to pass through the first sealing resin from an electrode drawn from the first component along the first main surface,
wherein on the surface of the first sealing resin on the side distant from the substrate, a plurality of external connection terminals are disposed in an outer peripheral portion, and the first conductor pattern is arranged such that at least a part of the first conductor pattern is located in an inner region surrounded by the plurality of external connection terminals.

6. The module according to claim 5, wherein
the first conductor pattern includes
   a main body portion arranged in the inner region, and
   a protruding portion extending from the main body portion to lie between the external connection terminals.

7. The module according to claim 5, wherein
the first conductor pattern extends to cover an entirety of the surface of the first sealing resin on the side distant from the substrate except for a region where the plurality of external connection terminals are located and a region where a mounted component mounted on the first main surface is exposed through the first sealing resin.

8. The module according to claim 1, wherein
a surface of the first component on the side distant from the first main surface is exposed through the first sealing resin.

9. The module according to claim 1, wherein
the metal member includes a columnar conductor.

10. The module according to claim 1, wherein
the metal member includes a wire.

11. The module according to claim 2, further comprising a shield film arranged to cover a surface of the second sealing resin on a side distant from the second main surface and a side surface of the second sealing resin, a side surface of the substrate, and a side surface of the first sealing resin.

12. The module according to claim 10, wherein
the wire is arranged to straddle the first component.

13. The module according to claim 2, wherein
the electrode is a ground electrode.

14. The module according to claim 2, wherein
the first conductor pattern is in a form of a frame in a plan view.

15. The module according to claim 3, wherein
the first conductor pattern is in a form of a frame in a plan view.

16. The module according to claim 2, wherein
on the surface of the first sealing resin on the side distant from the substrate, a plurality of external connection terminals are disposed in an outer peripheral portion, and the first conductor pattern is arranged such that at least a part of the first conductor pattern is located in an inner region surrounded by the plurality of external connection terminals.

17. The module according to claim 3, wherein
on the surface of the first sealing resin on the side distant from the substrate, a plurality of external connection terminals are disposed in an outer peripheral portion, and the first conductor pattern is arranged such that at least a part of the first conductor pattern is located in an inner region surrounded by the plurality of external connection terminals.

18. The module according to claim 6, wherein
the first conductor pattern extends to cover an entirety of the surface of the first sealing resin on the side distant from the substrate except for a region where the plurality of external connection terminals are located and a region where a mounted component mounted on the first main surface is exposed through the first sealing resin.

19. The module according to claim 2, wherein
a surface of the first component on the side distant from the first main surface is exposed through the first sealing resin.

20. The module according to claim 3, wherein
a surface of the first component on the side distant from the first main surface is exposed through the first sealing resin.

* * * * *